United States Patent [19]
Schnyder

[11] Patent Number: 5,221,175
[45] Date of Patent: Jun. 22, 1993

[54] TRANSPORT DEVICE FOR THE TRANSFER OF A WORKPIECE CARRIER

[75] Inventor: Hans Schnyder, Nürnberg, Fed. Rep. of Germany

[73] Assignee: Gebruder Decker KG, Nurnberg, Fed. Rep. of Germany

[21] Appl. No.: 779,799

[22] Filed: Oct. 21, 1991

[30] Foreign Application Priority Data

Oct. 29, 1990 [DE] Fed. Rep. of Germany ....... 4034355

[51] Int. Cl.⁵ .............................................. B25J 15/08
[52] U.S. Cl. .................................... 414/741; 414/225
[58] Field of Search ............... 414/680, 729, 741, 222, 414/225

[56] References Cited

U.S. PATENT DOCUMENTS

| | | | |
|---|---|---|---|
| 4,655,664 | 4/1987 | Feichtl et al. ................. | 414/225 X |
| 4,740,134 | 4/1988 | Dixon ............................ | 414/225 X |
| 4,923,352 | 5/1990 | Tamura et al. ................. | 414/225 |
| 5,033,929 | 7/1991 | Marti ............................. | 414/741 X |

FOREIGN PATENT DOCUMENTS 1315228 6/1987 U.S.S.R. ............................. 414/729

Primary Examiner—Michael S. Huppert
Assistant Examiner—Donald W. Underwood
Attorney, Agent, or Firm—Browdy and Neimark

[57] ABSTRACT

A transport device for the transfer of a workpiece carrier from a container for a first bath to a container for a second bath has a vertical sliding carriage. To this vertical sliding carriage at least one pivot arm is arranged, which carries the workpiece carrier to be transferred. The pivot range of the workpiece carrier is located exclusively below the pivot axis. By means of that a miminum possible transfer time is achieved.

20 Claims, 4 Drawing Sheets

TRANSPORT DEVICE FOR THE TRANSFER OF A WORKPIECE CARRIER

FIELD OF THE INVENTION

The invention relates to a transport device for the transfer of a workpiece carrier out of a first container open on top for a first bath in a liquid agent to a second container open on top for a second bath in a liquid agent, comprising at least one pivot arm holding the workpiece carrier, the pivot arm being pivotable around a horizontal pivot axis by means of a pivot driving motor between a position of the workpiece carrier in the first container and a position of the workpiece carrier in the second container, said horizontal pivot axis being located above the containers.

BACKGROUND OF THE INVENTION

In the manufacture of so-called wafers, i.e. silicon wafers, as initial products for the manufacture of electronic storage components, these wafers are hold at a distance in the workpiece carrier and are subject to a chemical treatment in a chemical active bath, this can be an acid or also a caustic solution. Subsequent to this bath they are transferred to an quenching bath for rinsing. The transfer must be carried out very quickly, since with a slow transfer rinsing droplets of the fluid can be formed on the surface of the silicon wafers, the droplets causing irregular chemical reactions, higher capture of particles and oxidations.

For the solution of this problem a transport device has already become known, the pivot arms of which convey the workpiece carrier from the obliquely downwards inclined position, in which they hold the workpiece carrier in the container for the chemical active bath, into the container for the quenching bath by means of a pivot movement upwards and then downwards over a total angle of approximately 270°. The required period of time is too long, since the distance to be covered is too large. Furthermore the centrifugal forces acting onto the workpieces are very high.

Furthermore it has become known for the solution of the same problem, to arrange a vertically moveable sliding carriage laterally to the containers, a pivot arm formed as a parallel control arm being arranged pivotably around a vertical axis on the sliding carriage, on the free end of the pivot arm a workpiece carrier being able to be hold by a pneumatic suction docking. The workpiece carrier is transferred by an upward movement of the sliding carriage, by a pivot movement of the pivot arm and by a downward movement of the sliding carriage. Apart from the high requirement of time it is disadvantageous in this case that clean-room conditions cannot be adhered to, which have to be observed in the manufacture of silicon wafers. Furthermore the sliding carriage and the guide bars must be made of stainless high-quality steel, which involves in turn the risk of metal abrasion. Metal abrasion, however, is especially harmful in the manufacture of such silicon wafers.

A further solution is that a vertical sliding carriage with carrier arms is provided, on which the workpiece carrier is arranged. This sliding carriage is moved upwards by conveying the workpiece carrier and then a collecting basin is immediately moved between the container for the active bath and the workpiece carrier, the basin collecting rinsing water arriving from above from a flood device on the workpieces. Subsequently the vertical sliding carriage is displaced horizontally and is lowered. The flood rinsing does not guarantee a uniform rinsing of the workpiece surface; therefore the long period of time until the immersion into an immersion rinsing bath is disadvantageous.

SUMMARY OF THE INVENTION

It is an object of the present invention to provide a transport device of the generic type, which ensures an extremely short transfer time and which enables in the vicinity of the workpiece carrier the use of exclusively highly wear-resistant and chemically high-resistant plastic materials under clean-room conditions.

This object is attained in accordance with the invention when the at least one pivot arm is fixed pivotably at a vertical sliding carriage which is vertically displaceable by means of a displacement driving motor around the horizontal pivot axis and when the pivot range is located exclusively below the pivot axis. By these measures the shortest possible way for the workpiece carrier from the container with the active bath to the container with the quenching bath is found. The at least one pivot arm, which holds the workpiece carrier, consequently carries out an oscillating pendulum movement of less than 180° around a horizontal pivot axis located between the two containers, during the transfer process from the first to the second container, this pivot axis moving simultaneously in vertical direction upwards or downwards. The shortest possible way can be covered with minimum possible accelerations in the shortest possible time.

An oppositely directed movement component of the pivot movement is superimposed to the upward movement of the vertical sliding carriage, and an oppositely directed movement component of the workpiece carrier is superimposed to the downward movement of the vertical sliding carriage. By means of that minimum possible vertical accelerations are achieved, if the driving motors are in such a way controllable that a pivot movement of the at least one pivot arm from a vertical plane which is placed through the position in the container to a vertical center plane between the containers is superimposed to an upward movement of the vertical sliding carriage and if a pivot movement of the at least one pivot arm from the center plane to a vertical plane which is placed through the position in the container is superimposed to a downward movement of the vertical sliding carriage. An optimization of the movement sequence and of the movement path during the transfer is achieved. By means of the measures according to the invention it is possible to keep the transfer time shorter than 2 seconds for e.g. 8-inch-silicon wafers, which are relatively large silicon wafers.

The invention makes it possible to arrange the transport sliding carriage under clean-room conditions and to provide only plastic materials for the baths in the vicinity of the containers. The driving motors, the guide bars and the guide devices for the vertical sliding carriage can be arranged outside of the clean room surrounding the baths.

Further details, advantages and features of the invention will become apparent from the ensuing description of one example of embodiment, taken in conjunction with the drawing.

DESCRIPTION OF THE PREFERRED EMBODIMENTS

Figure 1:
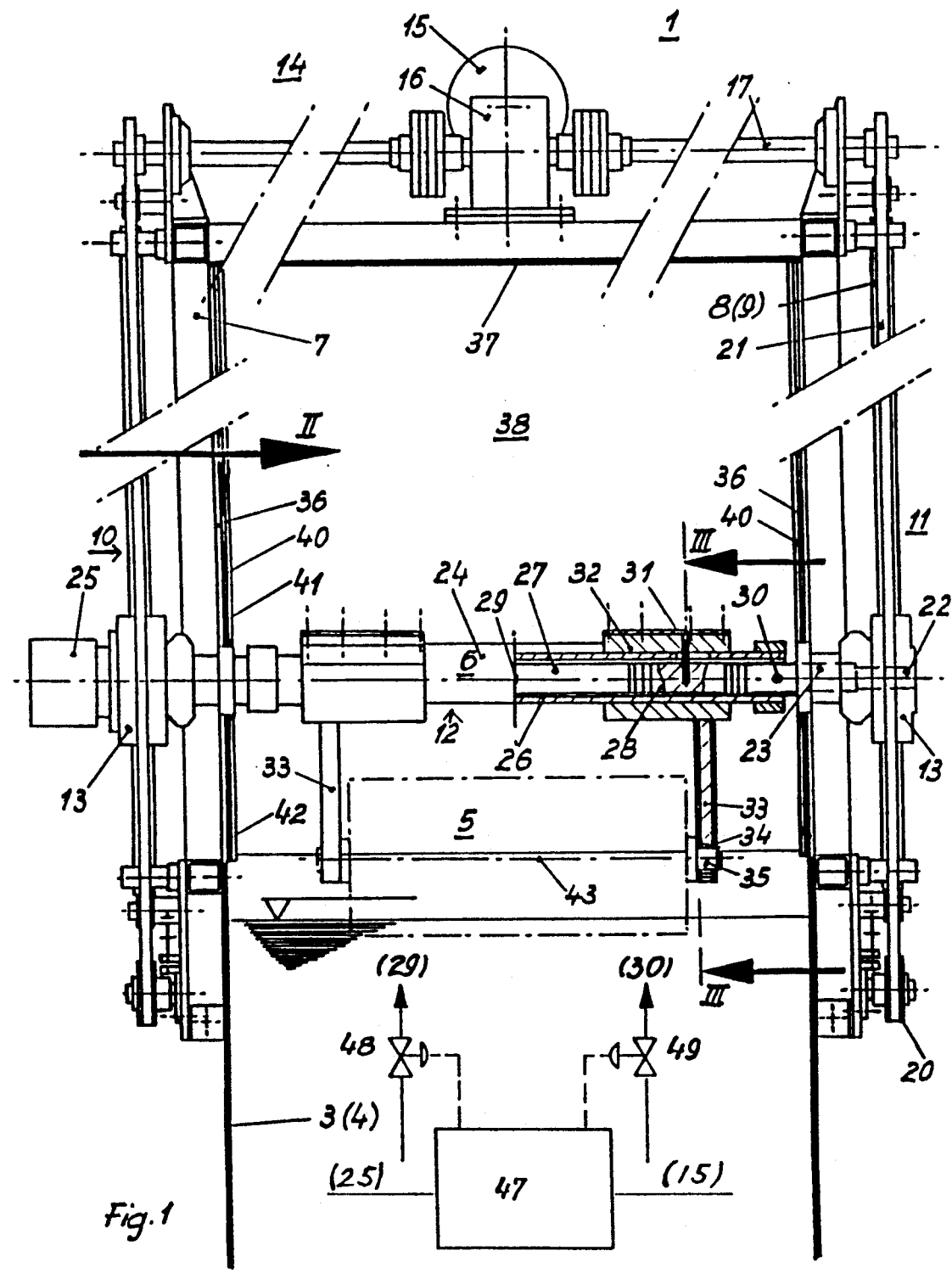
FIG. 1 shows a view of a transport device according to the arrow I in FIG. 2.
Figure 2:
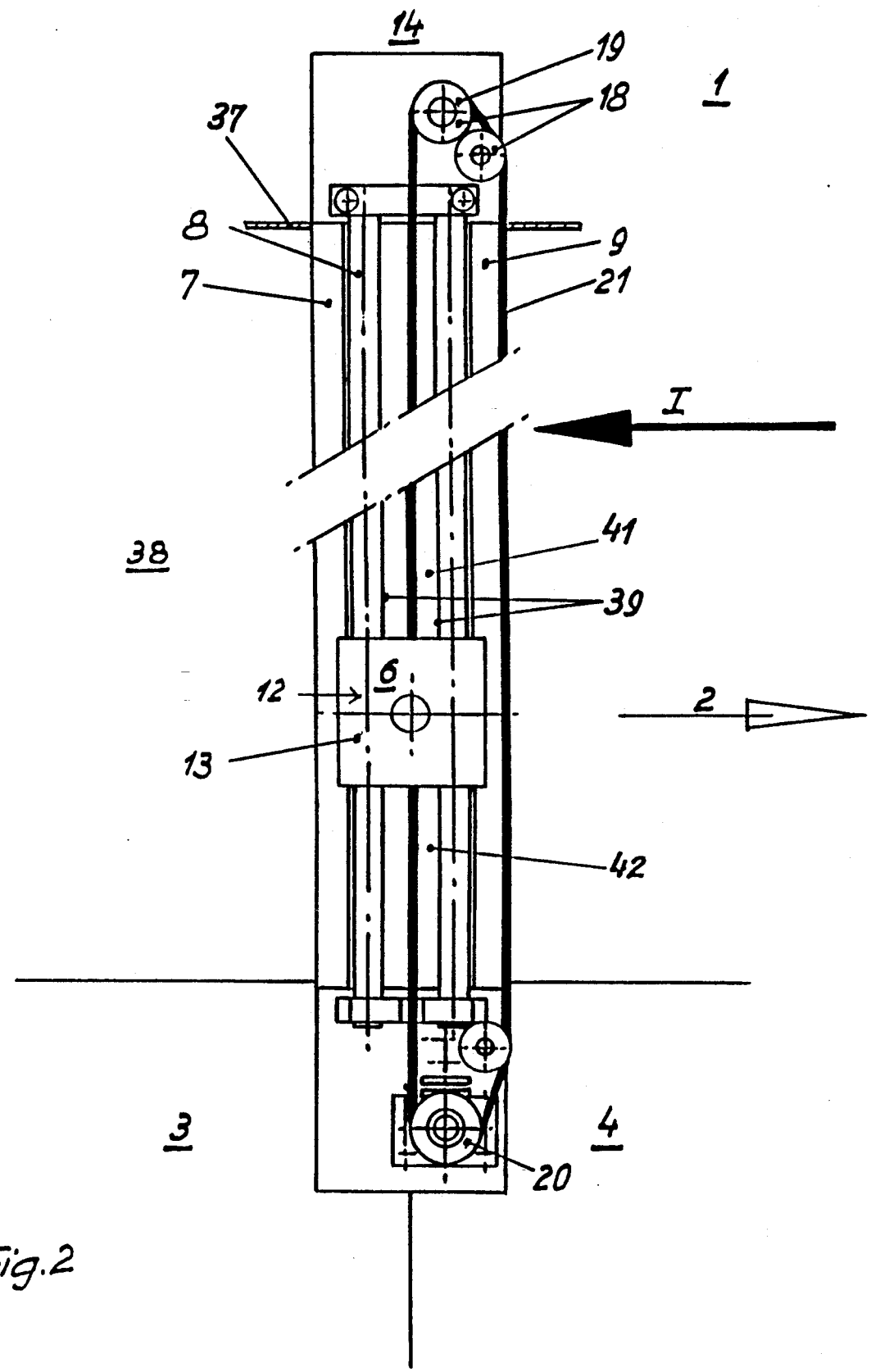
FIG. 2 shows a side view of the transport device according to the arrow II in FIG. 1.
Figure 3:
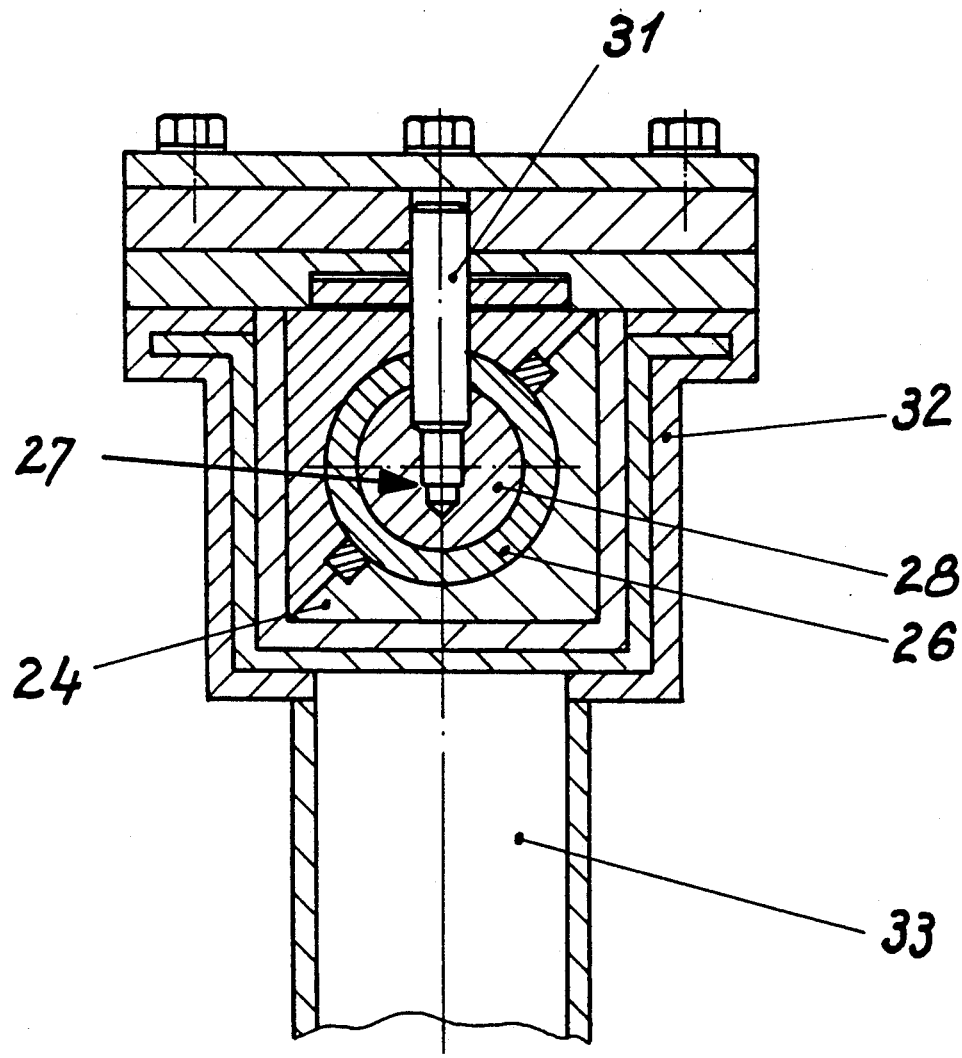
FIG. 3 shows a partial section through the vertical sliding carriage according to the cutting line III—III in FIG. 1

As can be seen from FIGS. 1 and 2, in a treatment plant 1 for the treatment of workpieces, for example silicon wafers, two open containers 3, 4 are arranged side by side in a transfer direction 2 in a chemical active bath and a subsequent quenching bath, which plant 1 is illustrated only in an outlined way. The container 3 is determined for a chemical active bath, i.e. for an acid or a caustic solution, whereas the container 4 is determined for a quenching bath, which is as a rule water. For the pick-up of the workpieces barrels 5 are provided serving as workpiece carriers, the barrels 5 being placed in the container 3, being conveyed from the container 3 to the container 4 and being again removed from the container 4 by means of a transport device 6. This transport device 6 is essentially arranged transversely to the transfer direction 2 and between and above the containers 3, 4. It has vertical guide bars 8, 9 which are arranged on a frame 7 of the plant 1, which frame 7 accommodates also the containers 3, 4, one pair of guide bars 8 and the other pair of guide bars 9 being arranged transversely to the transfer direction 2 at oppositely located sides 10, 11 of the frame 7. On the guide bars 8, 9 a vertical sliding carriage 12 is guided displaceable by means of sliding bearings 13. For a synchronical drive of the sliding bearings 13 and thus for the accurate parallel displacement of the vertical sliding carriage 12 on the guide bars 8, 9 a displacement driving motor 15 is arranged on the upper side 14 of the frame 7, the displacement driving motor 15 driving two timing belt drives 18 via a central distribution gear 16 and via driving shafts 17. The driving pinion 19 of the timing belt drives 18 is each connected against rotation with a driving shaft 17. A deflection pulley 20 is arranged stationary at the frame 7 below the respective guide bars 8 or 9. A timing belt 21 is guided via a driving pinion 19 and a deflection pulley 20, the one strand of the timing belt 21 being fixed at a sliding bearing 13. Therefore, according to the rotational direction of the driving motor 15 the vertical sliding carriage 12 is displaced upwards or downwards on the guide bars 8, 9.

The vertical sliding carriage 12 has a guide support 24 which is pivotable around a pivot axis 23 in the sliding bearings 13 by means of journal pins 22. A pivot movement of this guide support 24 is carried out by means of a pivot driving motor 25, which is flange connected to one of the two sliding bearings 13. The guide support 24 has a carrying core, which is formed by a cylinder 26 of a hydraulically or pneumatically driven piston cylinder drive 27, the journal pins 22 being also arranged on this core. This cylinder 26 is connected against rotation with the guide support 24 surrounding the cylinder 26. In the cylinder 26 two floating pistons 28 are arranged, which are driven with a pressure fluid either in common via a middle connection 29 located between the floating pistons 28 and opening towards the cylinder 26 or via two outer connections 30 each located between the floating pistons 28 and the adjacent sliding bearing 13 and opening towards the cylinder 26, and thus the floating pistons 28 can be displaced either in the cylinder 26 in the direction of the sliding bearings 13 or towards each other. With each piston 28 a conveyor 31 is connected leading out from the cylinder in a sealed manner. Each conveyor 31 engages with a sliding sleeve 32 which is fixed displaceable on the guide support 24 in the direction of its pivot axis 23. Since the guide support 24 has a non-circular cross-section, i.e. a rectangular and in particular a quadratic cross-section, and since the sliding sleeve 32 is adapted to this cross-section, it is fixed against rotation on the guide support 24. At each sliding sleeve 32 a pivot arm 33 is secured, the two arms 33 being arranged parallel to each other. They are provided each with a bearing bush 34 close to the free end of the arms 33 opposite to the sliding sleeve 32, in the bearing bush 34 of which journal pins 35, which are in alignment with one another, of the barrel 5 can be accommodated.

As outlined in the drawing, the plant 1 is completely closed in the vicinity of the containers 3, 4 by—if necessary transparent—covering walls 36, 37. In order to be able to pass the guide support 24 with the cylinder 26 of the transport device 6 through the inner room 38 which is limited by the lateral covering walls 36 above the containers 3, 4, vertically running slot-like recesses 39 are formed in the lateral covering walls 36, the recesses 39 being provided with guide grooves 40. In these guide grooves 40 strip-shaped sealing elements 41, 42 are arranged displaceable, which are disposed on the vertical sliding carriage 12 and which are following the vertical movement of the vertical sliding carriage 12 and which each close in a sealed manner the recesses 39 above and below the vertical sliding carriage 12. The inner room 38 of the plant 1 accommodating the containers 3, 4 thus is also completely closed in this area.

Figure 4:
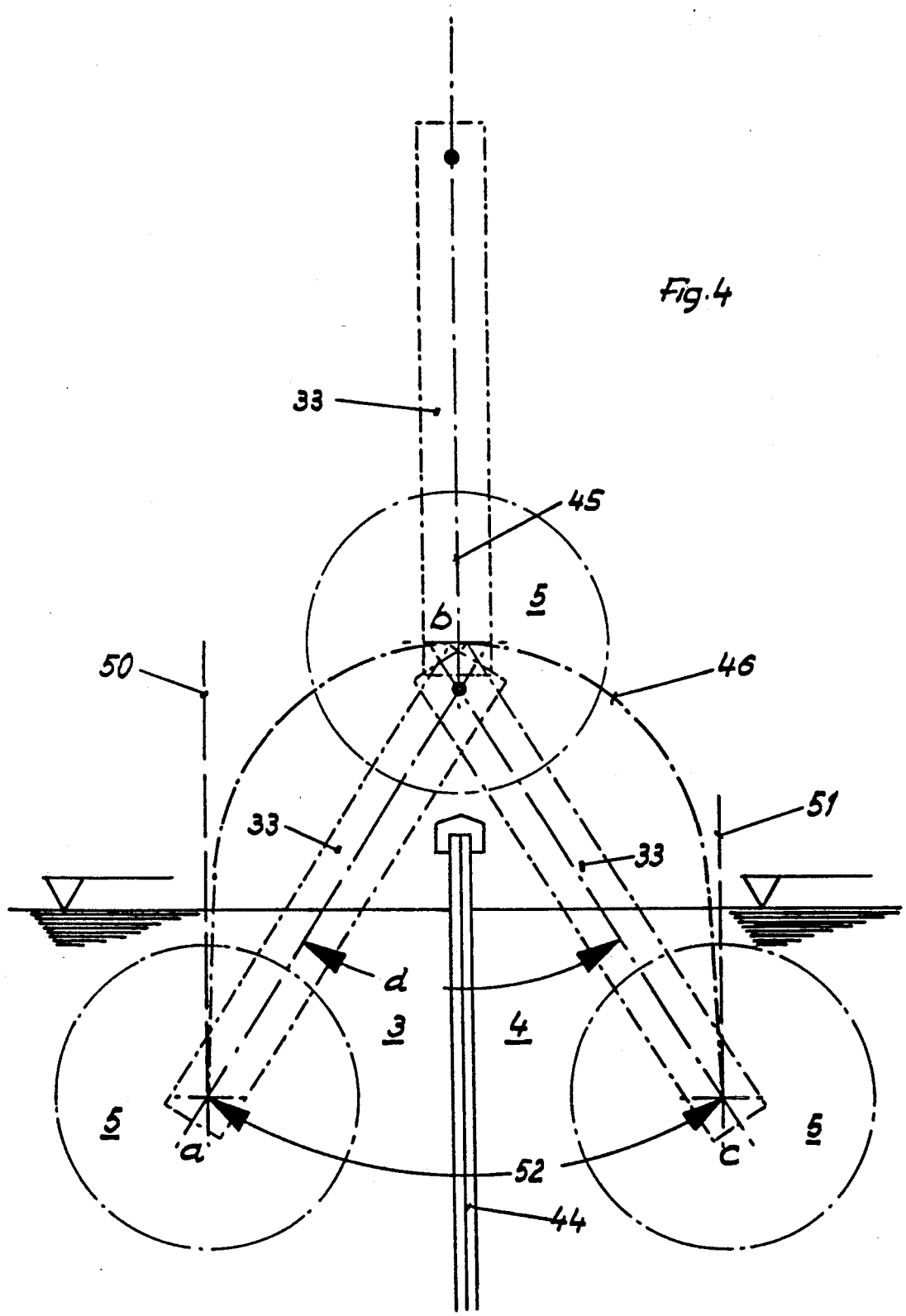
FIG. 4 shows the movement sequence of the transport device illustrated diagrammatically.

The mode of operation and in particular the transfer of a barrel 5 with workpieces from the container 3 with the active bath to the container 4 with the quenching bath is described taken in conjunction with FIG. 4 in the following.

A barrel 5 is accommodated in the pivot arms 33, i.e. the piston cylinder drive 27 is driven with a pressure fluid via its two outer connections 30, so that the sliding sleeves 32 are displaced with the two arms towards each other. The two journal 35 of the barrel 5 have thus arrived in the bearing bushes 34. The barrel 5 is pivotable around its center longitudinal axis 43 and is pivotably driveable in the container 3 by means of a drive, if necessary, which is not illustrated. In this case the barrel 5 is located in the position a shown in FIG. 4 on the left below, for the ensuing position indications the position of the axis 43 respectively being described. In order to transfer the barrel 5 from the container 3 to the container 4 over a partition wall 44 located between the containers 3, 4, the displacement driving motor 15 is put into operation. The sliding bearings 13 and with them the whole vertical sliding carriage 12 are conveyed to the top via the timing belt drives 18. Simultaneously, the pivot driving motor 25 is put into operation, so that the arms 33, which are coupled against rotation with the pivot driving motor 25 in the described manner, together with the barrel 5 are pivoted from the swung-out position of the arms 33 in the direction of the vertical center plane 45 of the transport device 6. This vertical center plane 45 runs through the pivot axis of the guide support 24 and between the guide bars 8, 9. With this pivot movement of the arms 33 with the barrel 5 in the direction of the center plane 45 the barrel 5 is moved downwards relatively to the center longitudinal axis 23. Thus an oppositely directed downward vertical movement of the barrel 5—which is even through minor—is superimposed to the upwards directed movement of the vertical sliding carriage 12. By means of that the acceleration of the barrel 5 which as a whole is directed upwards is minimized. On this occasion the center longitudinal axis 43 of the barrel 5 moves upwards on a continuously curved path 46 to an upper turning point b, the curvature of this path being selected so that the barrel 5 with its outer contour does neither collide with the container 3 nor with the partition wall 44 or other obstacles, simultaneously the distances to the mentioned obstacles, however, being kept as small as possible. At the highest point, i.e. the turning point b, of the path 46 the displacement driving motor 15 is reversed to the oppositely directed rotational direction, so that the vertical sliding carriage 12 with the barrel 5 is moved downwards. The displacement driving motor 25 continues to rotate in the same rotational direction, so that the barrel 5 with its center longitudinal axis 43 is pivoted outwards from the vertical center plane 45. On this occasion the barrel 5 is pivoted upwards relatively to the pivot axis 23 of the guide support 24. Also the superimposed movement resulting from the superposition of this downward movement of the vertical sliding carriage 12 and the relative upward movement of the barrel 5 thus leads to a minimization of the accelerations of the barrel 5. By means of that the barrel 5 is passed with a minimum period of time from the position a in the container 3 via the upper turning point b to a position c, which—related to the vertical center plane 45—is mirror symmetrical to the position a. In this position the barrel 5 is located in the quenching bath in the container 4.

In order to remove the barrel 5 from the holder in the arms 33, the piston cylinder drive 27 is driven with a pressure fluid in its middle connection 29, so that the two sliding sleeves 32 with the arms 33 are moved away from each other and thus the journal pins 35 of the barrel 5 are released.

The control of the driving motors 15 and 25 is carried out via a central freely programmable control 47, which also controls solenoid valves 48, 49 for the middle connection 29 or the outer connections 30.

Depending on the constructive and spacial opportunities in the vicinity of the sides facing each other of the containers 3, 4 and of the partition wall 44 it is also possible to first carry out a part of the upward movement of the vertical sliding carriage 12 and only then to initiate the pivot movement of the arms 33 by the driving motor 25. In this case the barrel 5 with its axis 43 is first lifted upwards from the position a in a vertical plane, which is placed vertically through the position a and which runs parallel to the center plane 45. In same manner in this case the pivot movement of the arms 35 to the position of the barrel 5 above the container 4 can already be finished, before the downward movement of the barrel 5 into the container 4 is completed. In this case the axis 43 of the barrel 5 is pivoted in a vertical plane 51, which runs parallel to the center plane and through the position c, before the position c is reached by the downward movement of the vertical sliding carriage 12.

The total pivot angle d of the arms 33 in their pivot range during the pivot movement from the position a to the position c is as a rule clearly smaller than 90°, i.e. in particular 60° to 70°. The lateral covering walls 36, the upper covering wall 37, naturally the containers 3, 4 and the partition wall 44 and the sealing elements 41, 42, in particular, however, the part of the vertical sliding carriage 12 located in the inner room 38 as far as they are open, as well as the pivot arms 33, the sliding sleeves 32 and the supports 24 are made of highly wear-resistant, chemically high-resistant plastic material, such as e.g. polytetrafluor ethylene or PVDF (polyvinylidenefluoride). The metal parts, such as e.g. the guide bars 8, 9, the driving motors 15, 25 are completely outside of the inner room 38.

What is claimed is:

1. A transport device for the transfer of a workpiece carrier (5) out of a first container (3) open on top for a first bath in a liquid agent to a second container (4) open on top for a second bath in a liquid agent, comprising
   at least one pivot arm (33) holding the workpiece carrier (5), the pivot arm (33) being pivotable around a horizontal pivot axis (23) by means of a pivot driving motor (25) between a position (a) of the workpiece carrier (5) in the first container (3) and a position (c) of the workpiece carrier (5) in the second container (4), said horizontal pivot axis (23) being located above the containers (3,4),
   wherein the at least one pivot arm (33) is pivotally mounted to a vertical sliding carriage (12) which is vertically displaceable by means of a displacement driving motor (15) and wherein the pivot range (52) is located exclusively below the pivot axis (23),
   wherein the vertical sliding carriage (12) is guided displaceable on vertical guide bars (8,9) by means of sliding bearings (13), which are arranged on a frame (7) for the containers (3, 4),
   wherein the vertical sliding carriage (12) has a guide support (24), which is pivotably fixed in the sliding bearings (13) to permit the arm to pivot, and
   wherein opposite ends of the guide support (24) are passed through vertical slot-like recesses (39), each in lateral covering walls (36), which are each arranged between the containers (3,4) and the guide bars (8,9).

2. A device according to claim 1, wherein said driving motors (15, 25) are in such a way controllable that a pivot movement of the at least one pivot arm (33) from a vertical plane (50) which is placed through the position (a) in the container (3) to a vertical center plane (45) between the containers (3, 4) is superimposed to an upward movement of the vertical sliding carriage (12) and that a pivot movement of the at least one pivot arm (33) from said center plane (45) to a vertical plane (51) which is placed through the position (c) in the container (4) is superimposed to a downward movement of the vertical sliding carriage (12).

3. A device according to claim 1, wherein the displacement driving motor (15) is arranged on the frame (7) for the containers (3, 4) and is coupled with the sliding bearings (13) via timing belt drives (18).

4. A device according to claim 1, wherein the pivot driving motor (25) is mounted at one of said sliding bearings (13).

5. A device according to claim 1, wherein strip-shaped sealing elements (41, 42) are located at the guide support (24), the sealing elements (41, 42) being arranged in the vicinity of each recess (39) of said recesses, and extending each approximately over the distance of a displacement way of the vertical sliding carriage (12).

6. A device according to claim 5, wherein the sealing elements (41, 42) are guided in guide grooves (40) limiting the recesses (39) in the lateral covering walls (36).

7. A transport device for the transfer of a workpiece carrier (5) out of a first container (3) open on top for a first bath in a liquid agent to a second container (4) open on top for a second bath in a liquid agent, comprising at least one pivot arm (33) holding the workpiece carrier (5), the pivot arm (33) being pivotable around a horizontal pivot axis (23) by means of a pivot driving motor (25) between a position (a) of the workpiece carrier (5) in the first container (3) and a position (c) of the workpiece carrier (5) in the second container (4), said horizontal pivot axis (23) being located above the containers (3, 4), wherein the at least one pivot arm (33) is pivotally mounted to a vertical sliding carriage (12) which is vertically displaceable by means of a displacement driving motor (15) and wherein the pivot range (52) is located exclusively below the pivot axis 23, wherein the vertical sliding carriage (12) is guided displaceable on vertical guide bars (8, 9) by means of sliding bearings (13), which are arranged on a frame (7) for the containers (3, 4), wherein the vertical sliding carriage (12) has a guide support (24), which is pivotably fixed in the sliding bearings (13) and passed through vertical slot-like recesses (39) in lateral covering walls, wherein at least one pivot arm (33) is connected with the guide support (24) by means for precluding rotation on the guide support while permitting displacement on the latter in the direction of the pivot axis (23).

8. A device according to claim 1, wherein a piston cylinder drive (27) which is driven with a pressure fluid and which is connected with the at least one pivot arm (33) is arranged in the guide support (24) for providing lateral displacement of the at least one pivot arm.

9. A device according to claim 8, wherein the piston cylinder drive (27) engages with a sliding sleeve (32) which carries the at least one pivot arm (33), the sliding sleeve (32) being fixed on the guide support (24) by means for precluding rotation, and being arranged displaceable in the direction of the pivot axis (23).

10. A device according to claim 1, wherein the guide support (24) and the at least one pivot arm (33) are made of highly wear-resistant and chemically resistant plastic material.

11. A device according to claim 5, wherein the lateral covering walls (36) and an upper covering wall (37) connecting the lateral covering walls (36) above the vertical sliding carriage (12) and the sealing elements (41, 42) are made of a highly wear-resistant and chemically resistant plastic material.

12. A device according to claim 7, wherein said driving motors (15, 25) are in such a way controllable that a pivot movement of the at least one pivot arm (33) from a vertical plane (50) which is placed through the position (a) in the container (3) to a vertical center plane (45) between the containers (3,4) is superimposed to an upward movement of the vertical sliding carriage (12) and that a pivot movement of the at least one pivot arm (33) from said center plane (45) to a vertical plane (51) which is placed through the position (c) in the container (4) is superimposed to a downward movement of the vertical sliding carriage (12).

13. A device according to claim 7, wherein the displacement driving motor (15) is arranged on the frame (7) for the containers (3,4) and is coupled with the sliding bearings (13) via timing belt drives (18).

14. A device according to claim 7, wherein the pivot driving motor (25) is mounted at one of said sliding bearings (13).

15. A device according to claim 7, wherein strip-shaped sealing elements (41,42) located at the guide support (24), the sealing elements (41,42) being arranged in the vicinity of each recess (39) of said recesses, and extending each approximately over the distance of a displacement way of the vertical sliding carriage (12).

16. A device according to claim 15, wherein the sealing elements (41,42) are guided in guide grooves (40) limiting the recesses (39) in the lateral covering walls (36).

17. A device according to claim 7, wherein a piston cylinder drive (27) which is driven with a pressure fluid and which is connected with the at least one pivot arm (33) is arranged in the guide support (24) for providing lateral displacement of the at least one pivot arm.

18. A device according to claim 17, wherein the piston cylinder drive (27) engages with a sliding sleeve (32) which carries the at least one pivot arm (33), the sliding sleeve (32) being fixed on the guide support (24) by means for precluding rotation, and being arranged displaceable in the direction of the pivot axis (23).

19. A device according to claim 7, wherein the guide support (24) and the at least one pivot arm (33) are made of highly wear-resistant and chemically resistant plastic material.

20. A device according to claim 15, wherein the lateral covering walls (36) and an upper covering wall (37) connecting the lateral covering walls (36) above the vertical sliding carriage (12) and the sealing elements (41,42) are made of a highly wear-resistant and chemically resistant plastic material.

* * * * *